United States Patent
Javora et al.

(10) Patent No.: US 9,588,151 B2
(45) Date of Patent: Mar. 7, 2017

(54) VOLTAGE AND/OR CURRENT SENSING DEVICE FOR LOW-, MEDIUM- OR HIGH VOLTAGE SWITCHING DEVICES

(71) Applicant: ABB TECHNOLOGY AG, Zürich (CH)

(72) Inventors: Radek Javora, Brno (CZ); David Raschka, Ivancice (CZ)

(73) Assignee: ABB Schweiz AG, Baden (CH)

(*) Notice: Subject to any disclaimer, the term of this patent is extended or adjusted under 35 U.S.C. 154(b) by 277 days.

(21) Appl. No.: 14/336,398

(22) Filed: Jul. 21, 2014

(65) Prior Publication Data

US 2014/0333282 A1    Nov. 13, 2014

Related U.S. Application Data

(63) Continuation of application No. PCT/EP2013/000145, filed on Jan. 18, 2013.

(30) Foreign Application Priority Data

Jan. 19, 2012    (EP) .................................... 12000298

(51) Int. Cl.
*G01R 19/00* (2006.01)
*G01R 15/14* (2006.01)
(Continued)

(52) U.S. Cl.
CPC ........... *G01R 19/00* (2013.01); *G01R 15/142* (2013.01); *G01R 19/0084* (2013.01);
(Continued)

(58) Field of Classification Search
CPC G01R 19/00; G01R 19/0084; G01R 19/0092; G01R 19/30; G01R 15/12;
(Continued)

(56) References Cited

U.S. PATENT DOCUMENTS

| | | |
|---|---|---|
| 5,272,460 A | 12/1993 | Baumgartner et al. |
| 5,585,611 A | 12/1996 | Harvey et al. |

(Continued)

FOREIGN PATENT DOCUMENTS

| | | |
|---|---|---|
| EP | 0 510 311 A2 | 10/1992 |
| EP | 0 851 442 A2 | 7/1998 |
| WO | WO 2008/151937 A1 | 12/2008 |

OTHER PUBLICATIONS

International Search Report (PCT/ISA/210) mailed on May 14, 2013, by the European Patent Office as the International Searching Authority for International Application No. PCT/EP2013/000145.

(Continued)

*Primary Examiner* — Hoai-An D Nguyen
(74) *Attorney, Agent, or Firm* — Taft Stettinius & Hollister LLP

(57) ABSTRACT

A voltage and/or current sensing device for low-, medium- or high voltage switching devices is disclosed as a constructively enhanced measuring device with high performance for use in switching devices. The sensing device can include a first voltage sensing part, a second voltage sensing part and a current sensing part all arranged in a same common single housing separated, from the switching device, in a way that an output wire from the first voltage sensing part, for sensing voltage at an upper terminal of the switching device, is located close to the current sensing part, the output wire being applied with an insulating cover, and mechanically fixed to the current sensor part, and/or the output wire being implemented in an isolation body, and only located near to the current sensing part.

20 Claims, 6 Drawing Sheets

(51) Int. Cl.
*H01H 33/02* (2006.01)
*H01H 71/12* (2006.01)
*H01H 83/10* (2006.01)
*H01H 83/12* (2006.01)

(52) U.S. Cl.
CPC ....... *G01R 19/0092* (2013.01); *H01H 33/027* (2013.01); *H01H 71/125* (2013.01); *H01H 83/10* (2013.01); *H01H 83/12* (2013.01)

(58) Field of Classification Search
CPC .... G01R 15/142; G01R 15/144; G01R 21/06; G01R 21/08; G01R 21/133; G01R 31/261; G01R 31/2623; H01H 33/027; H01H 71/125; H01H 83/10; H01H 83/12
USPC ...................................................... 324/76.11
See application file for complete search history.

(56) References Cited

U.S. PATENT DOCUMENTS

| | | | | |
|---|---|---|---|---|
| 2003/0006749 | A1* | 1/2003 | Rollman | G01R 19/25 324/76.11 |
| 2010/0170774 | A1* | 7/2010 | Einschenk | H01H 33/027 200/48 R |
| 2015/0153391 | A1* | 6/2015 | Podzemny | G01R 1/18 324/126 |

OTHER PUBLICATIONS

Written Opinion (PCT/ISA/237) mailed on May 14, 2013, by the European Patent Office as the International Searching Authority for International Application No. PCT/EP2013/000145.
European Search Report mailed on Jun. 11, 2012.

\* cited by examiner

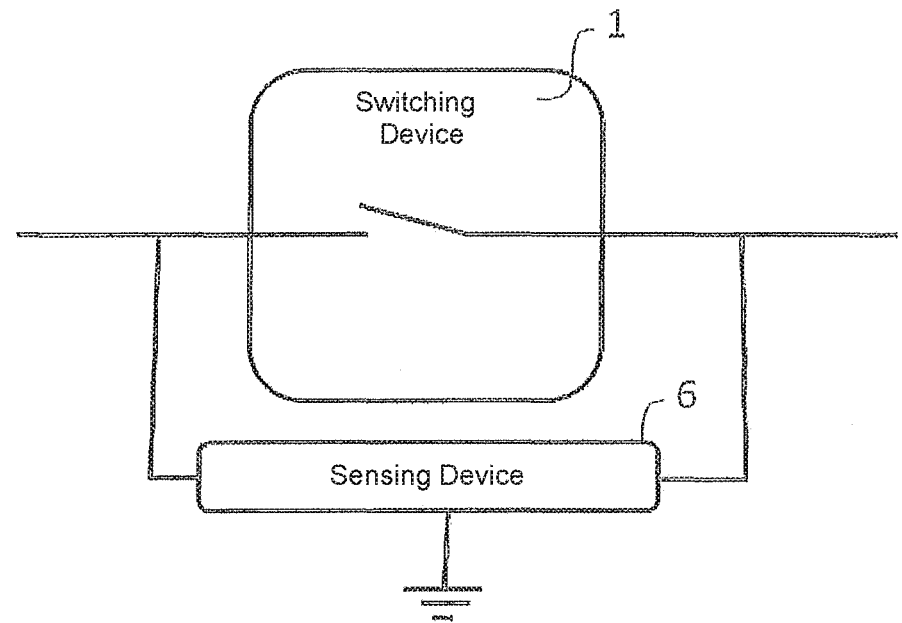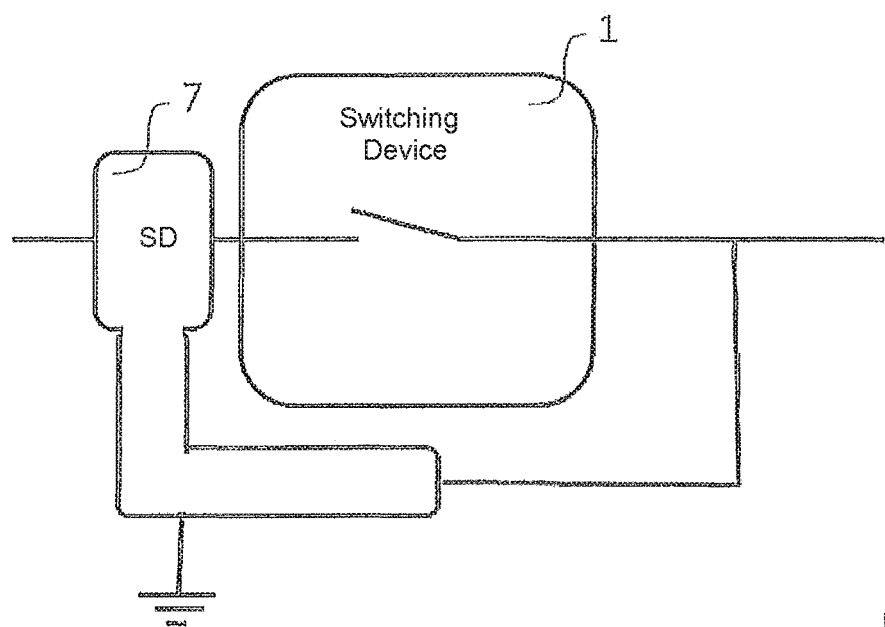
Figure 1

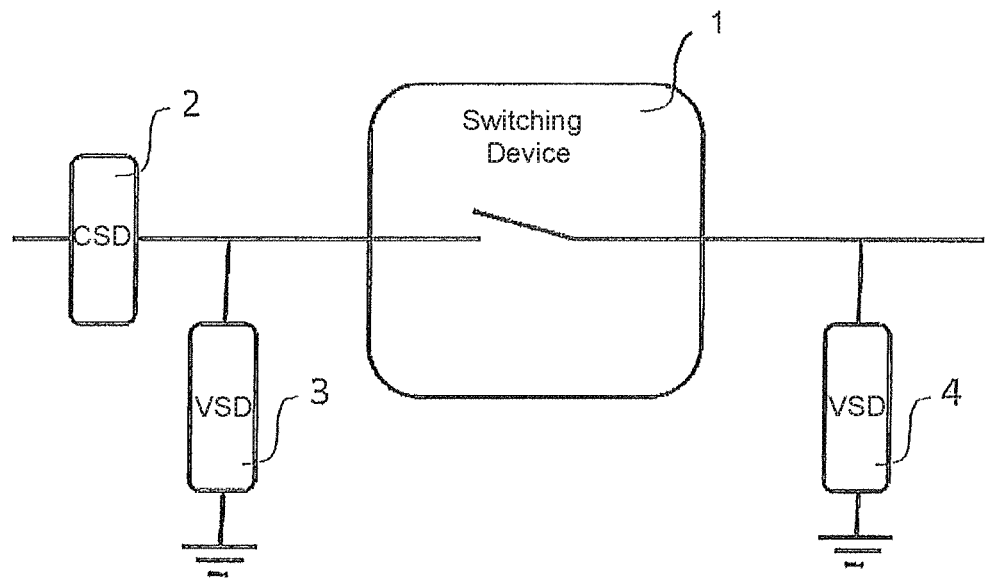
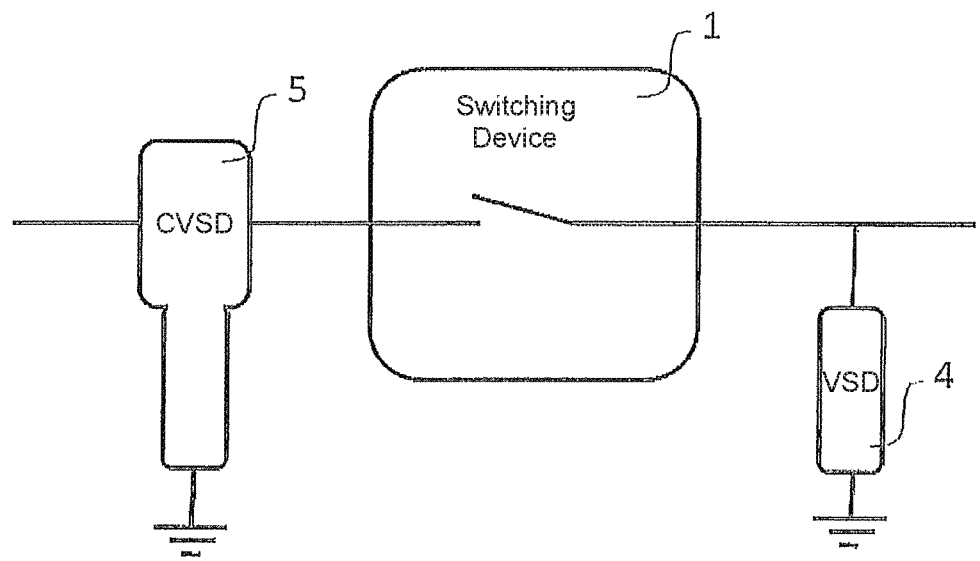
Figure 5

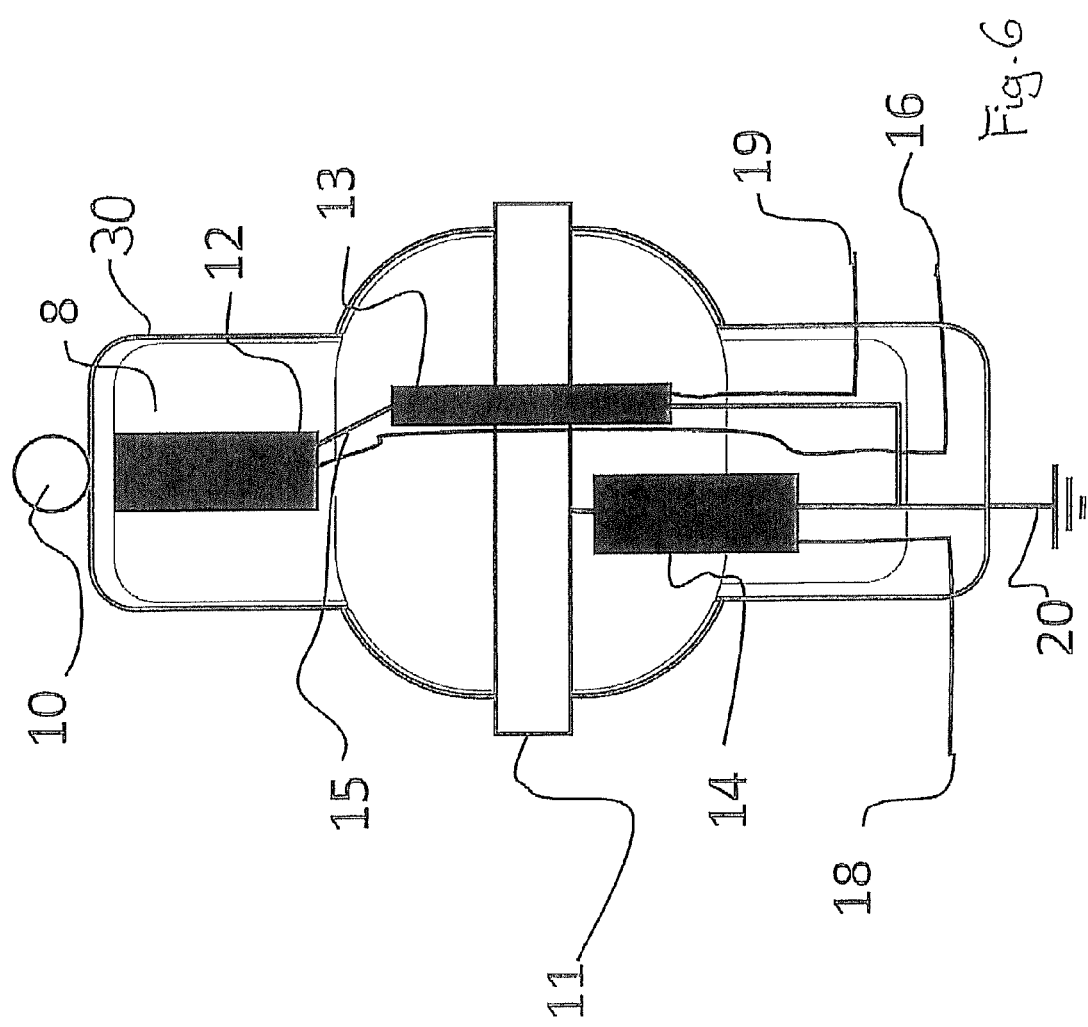

VOLTAGE AND/OR CURRENT SENSING DEVICE FOR LOW-, MEDIUM- OR HIGH VOLTAGE SWITCHING DEVICES

RELATED APPLICATION

This application claims priority as a continuation application under 35 U.S.C. §120 to PCT/EP2013/000145, which was filed as an International Application on Jan. 18, 2013 designating the U.S., and which claims priority to European Application 12000298.5 filed in Europe on Jan. 19, 2012. The entire contents of these applications are hereby incorporated by reference in their entireties.

FIELD

The present disclosure relates to a voltage and/or current sensing device for low-, medium- or high voltage switching devices connected to an upper and/or a lower terminal of the switching device and the ground potential.

BACKGROUND INFORMATION

Presently, single current or voltage sensing devices exist. In case of sensing voltage and/or current on a disconnecting or switching device, two voltage measurements are installed at both ends of a switching device in order to cover both, connected and disconnected states of the device. It is sufficient to sense current only at one end of the device as the current is flowing only in the case of a connected state of the switching device.

A known approach of sensing current and voltage over switching devices uses one separate current sensing device and two separate phase-to-ground voltage sensing devices located each on different sides of the swithing device.

WO 2008/151937 as well as EP 0 510 311 A2 disclose voltage and/or current sensor devices, which are integrated in the same isolation body as the high-voltage switch itself. So capacitive and/or inductive disturbances as well as the inability of changing or retrofitting the sensor devices, can be disadvantages of these known state of the art constructions.

SUMMARY

A voltage and/or current sensing device is disclosed for a low-, medium- or high voltage switching device, for connection to an upper and/or a lower terminal of such a switching device and to ground potential, the sensing device comprising: a first voltage sensing part; a second voltage sensing part; and a current sensing part arranged with the first and second voltage sensing parts in a single common housing to be separate from a switching device, and having an output wire from the first voltage sensing part for sensing voltage at an upper terminal of a switching device, the output wire being either: located close to the current sensing part with an insulating cover and being mechanically fixed to the current sensor part; or the output wire being implemented in an isolation body located close to the current sensing part.

BRIEF DESCRIPTION OF THE DRAWINGS

Several examples and advantageous embodiments disclosed herein are shown in the figures as follows:

FIG. 1: shows an exemplary double voltage switching device;

FIG. 5: shows an exemplary further embodiment; and

FIG. 6: shows an exemplary further alternative arrangement of the sensors.

DETAILED DESCRIPTION

Figure 2:
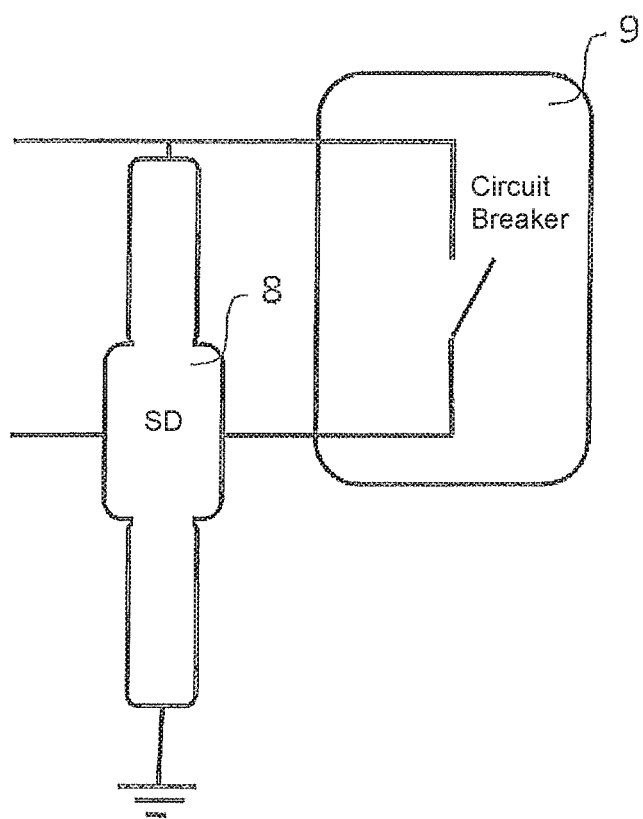
FIG. 2: shows an exemplary double voltage sensing device with current sensing.

A constructively enhanced measuring device with high performance is disclosed for the use in switching devices.

As disclosed herein, this can be a sensing device which includes a first voltage sensing part, and a second voltage sensing part and a current sensing part all arranged in a same common, separated from the switching device single housing, in such a way that an output wire from the first voltage sensing part sensing voltage at an upper terminal of the switching device, is located close to the current sensing part, the output wire being applied with an insulating cover, and mechanically fixed to the current sensor part, and/or the output wire being implemented in an isolation body, and only located near to the current sensing part.

The switching device and the sensing device can be implemented in different devices. Furthermore, a functional feature is disclosed whereby two voltage measurements and one current measurement are located in a common housing (e.g., in the same sensing device body).

By using such a structural feature, it can be implemented for either of, for example, two options, where each option provides a similar functionality of using two voltage measurements and one current measurement in one common device.

A first alternative is that a location of a voltage device output wire near (i.e., close) to the current sensing part is realized by the use of an isolated wire, which is mechanically fixed to the current sensor part. A second alternative is, that for example in use of an unisolated wire, it is implemented or integrated in the resin (isolation) body of the sensing device, near to the current sensing part.

In an exemplary embodiment, a single measuring device enables measuring voltages on both ends of devices, such as a circuit breaker or disconnector. A special construction of such a device can allow combination of two phase-to-ground voltage measurements and current measurement into a single design.

Further embodiments of course, are possible, such as:

An exemplary embodiment which includes a second voltage sensing part located between the current sensing part and lower terminal of the switching device.

Another exemplary detail is a second voltage sensing part which is located in parallel to the current sensing part, and connected between the lower terminal and the ground potential of the switching device.

An exemplary alternative according to the type of voltage sensor is that at least the first of the voltage sensing parts, located at the upper terminal can be applied with, or arranged as a resistive divider. This can include both voltage sensing parts being applied with or arranged as a resistive divider.

Another exemplary alternative is that the first voltage sensing part, located at the upper terminal is applied with, or arranged as a resistive divider, and the second voltage sensing part located at the lower terminal is applied with, or arranged as a capacitive divider.

The use of low-power current and voltage sensing technologies as current and voltage sensing parts can be included.

Furthermore, a current transformer for a current sensing part and/or voltage transformer for at least one voltage sensing part can be applied.

An exemplary embodiment of practical value is that the sensing device contains two voltage sensing parts.

For exemplary applications, it can also be advantageous that instead of implementing two voltage sensing parts, the sensing device contains one voltage sensing part and one current sensing part.

An exemplary device can be used alternatively: a first alternative is that the sensing device is applied for single phase application. The device can also be applied for multiple phase application, wherein each phase is applied with one independent sensing device.

In an exemplary application, the sensing device can be used in switchgears with a circuit breaker or vacuum circuit breaker, where the sensing device is in the near of a pole part, which contains the vacuum circuit breaker. For this application or in general, the sensing device can be very compact, and in practical use, in switchgear arrangements which can also be compact.

According to an exemplary compact arrangement, the sensing device can be positioned in parallel to the circuit breaker or pole part long axis.

Furthermore, the sensing device can have a high practical relevance for use in disconnectors, in order to ensure also security effects.

For example, in order to eliminate a need for several sensing devices, reduce the installation costs and simplify assembly, all sensing requirements can be integrated into a single device. Such a device might be either a single phase device or even a multiphase device. In the following, only a single phase device for sensing will be described. An exemplary concept and shape of such a device is shown in FIG. 1.

FIG. 1 shows an exemplary double voltage sensing device 6 over a switching device 1.

A current sensing device can be integrated inside of the same device; see bottom part of FIG. 1, which shows a double voltage sensing device with a current sensing integrated device 7.

Sensing of current and voltage can be realized by different means; e.g., by known current and voltage instrument transformers, or low-power current and voltage sensors could be used. An exemplary advantage and reduced size of such a solution can, for example, be achieved by low-power sensors.

An exemplary design that follows the same idea as in FIG. 1 (bottom) and that can be size optimized is shown in FIG. 2. In this case the switching device is a circuit breaker that has contact arms located above each other. Such a concept can have less space available between the contact arms and a sensing solution can be then fully optimized. FIG. 2 shows a double voltage sensing device with current sensing 8 used for a circuit breaker 9 solution with parallel contact arms.

Both phase-to-ground voltage sensing parts of the device 8 can connect one of their ends to the line voltage to be sensed and the other one of their ends to the ground potential. In order to achieve desirable electrical parameters, with voltage distribution between the contact arms and optimized space, a design of the sensing device 8, which is a current sensor, integrated with a double voltage sensing device, can be implemented as shown, for example in FIG. 3.

Figure 3:
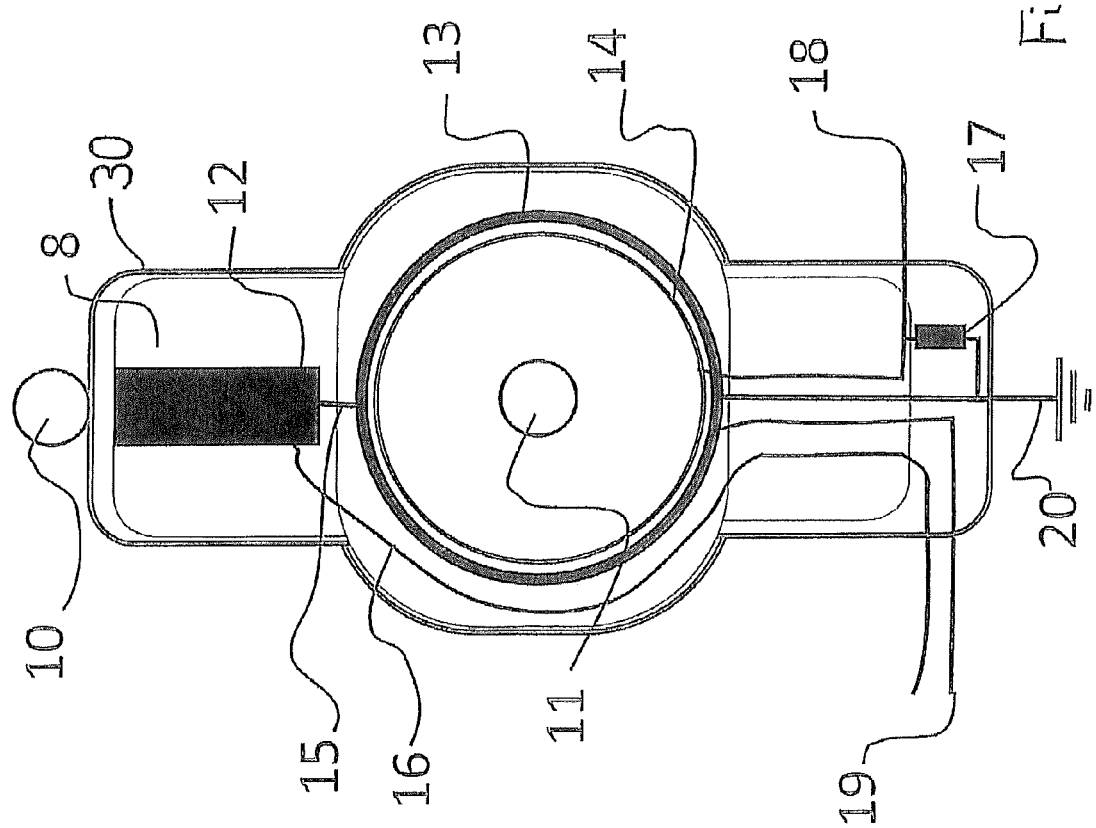
FIG. 3: shows an exemplary compact sensing device.

FIG. 3 shows an exemplary construction of a double voltage sensing device with integrated current sensing. FIG. 3 shows a sensing device 8 having a first voltage sensing device 12, such as a resistive voltage divider, located at an upper terminal of a switching device with an output wire 16 shown close to a current sensing device 13 such as a low-power current sensor; and a second voltage sensing device 14, such as a capacitive voltage divider. Line voltage to be sensed can be a potential at upper terminal 10 of the circuit breaker 9 relative to lower terminal 11.

First voltage sensing device 12 can have ground connection 15 connected to the grounded shield of current sensing device 13. Output wire 16 of the first voltage sensing device 12 can be located close to the current sensing device 13, but the two can be insulated from each other (e.g., the two can be sufficiently close that the two would interface electrically if not insulated). Output from current sensing device 13 can be achieved by means of two output wires 19. A main part of a second voltage sensing device 14 is located within a current sensing device 13, but a secondary impedance 17 of the second voltage sensing device 14 can be located outside current sensing device 13. An output of a second voltage sensing device 14 can be realized by output wire 18.

All outputs 16, 18 and 19 from sensing elements can be insulated from each other. They might have a separate output wire or cable each, or they all could be also integrated into one output cable. A second alternative is, that for example in use of an unisolated wire, it is implemented or integrated in the resin (isolation) body of the sensing device, near to the current sensing part.

One end of both voltage sensing devices 12 and 14 can be connected to the ground terminal 20. In case the current sensing device is electrically shielded, such shield can be connected to the grounding terminal 20 as well.

Figure 4:
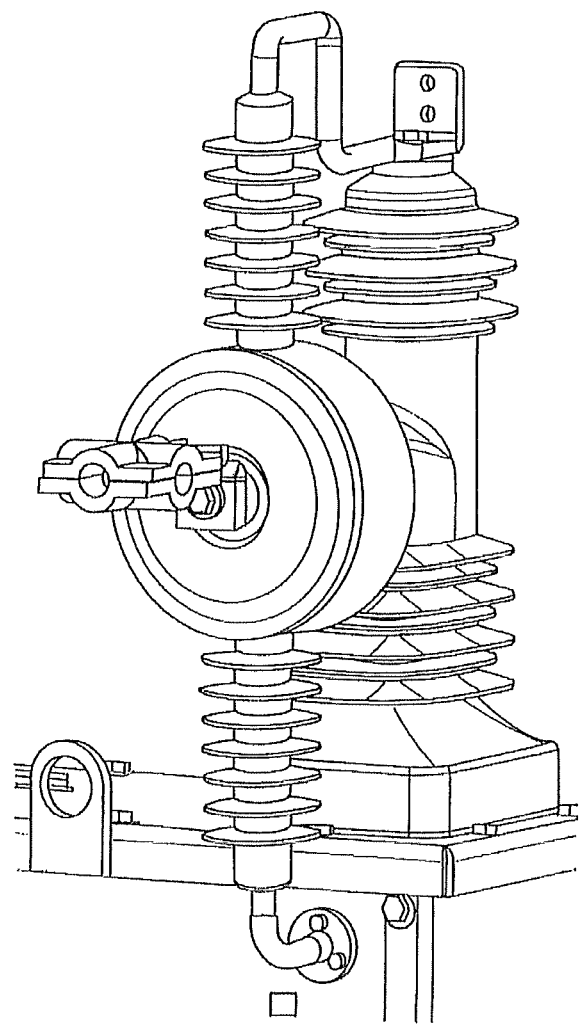
FIG. 4: shows an exemplary embodiment in use with a medium voltage circuit breaker.

FIG. 4 shows exemplary compact and near placement of a disclosed related switching device in parallel to a long axis of a known medium voltage pole part.

FIG. 5 shows a further exemplary embodiment: A Top Part of FIG. 5 shows separate current 2 and voltage 3, 4 sensing devices over the switching device 1. Such a device could be either a single-phase device or the same approach could be applied in case of a three-phase device as well. In that case, the same arrangement can be provided in all three phases.

In some cases there can be solutions using combined sensors on one side, integrating current and voltage measurement on one side into a single one-phase device. Voltage sensing on the other side can involve a separate device.

A Bottom Part of FIG. 5 shows a combined current and voltage sensing device 5, which is a combined current and voltage sensing device on one side and single voltage sensing device 4 on the other side of switching device 1.

FIG. 6 shows a further exemplary alternative concerning the arrangement of several sensors in a housing 30. The second voltage sensing part 14 can be located in parallel to the current sensing part 13 and connected between the lower terminal 11 and the ground terminal 20 of the switching device.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

POSITION NUMBERS 1 switching device
2 current sensor
3 voltage sensor
4 voltage sensor
5 combined current and voltage sensing device
6 double voltage sensing device
7 current sensor integrated with double voltage sensing device
8 current sensor integrated with double voltage sensing device
9 circuit breaker
10 upper terminal
11 lower terminal
12 voltage sensing device
13 current sensing device
14 voltage sensing device
15 ground connection
16 output of sensing device
17 secondary impedance
18 output of sensing device
19 output of sensing device
20 ground terminal
30 housing

The invention claimed is:

1. A sensing device for a low-voltage, medium-voltage or high voltage switching device, for connection to a terminal of such a switching device and to ground potential, the sensing device comprising:
   a first voltage sensing part;
   a second voltage sensing part; and
   a current sensing part arranged with the first and second voltage sensing parts in a single common sensing device housing separate from the switching device, and having an output wire from the first voltage sensing part for sensing voltage at an upper terminal of the switching device, the output wire extending within the sensing device housing and being insulated from the current sensing part;
   wherein the switching device and the sensing device comprise different devices, the first voltage sensing part, the second voltage sensing part, and the current sensing part thereby being located in the sensing device housing separate from the switching device.

2. The sensing device according to claim 1, wherein the second voltage sensing part is located between the current sensing part and a connection for a lower terminal of the switching device.

3. The sensing device according to claim 1, wherein the second voltage sensing part is located in parallel to the current sensing part, for connection between a lower terminal and ground potential of the switching device.

4. The sensing device according to claim 1, wherein at least the first of the voltage sensing parts, located at the upper terminal is a resistive divider.

5. The sensing device according to claim 1, wherein the first voltage sensing part, located at the upper terminal is applied with, or arranged as resistive divider, and the second voltage sensing part located at the lower terminal is a capacitive divider.

6. The sensing device according to claim 1, comprising:
   low-power current and voltage sensing technologies as current and voltage sensing parts.

7. The sensing device according to claim 1, comprising:
   a current transformer for a current sensing part and/or a voltage transformer for at least one voltage sensing part.

8. The sensing device according to claim 1, wherein the sensing device comprises:
   two voltage sensing parts.

9. The sensing device according to claim 1, wherein the sensing device comprises:
   one voltage sensing part and one current sensing part.

10. The sensing device according to claim 1, wherein the sensing device is configured for single phase detection.

11. The sensing device according to claim 1, wherein the sensing device is configured for three phase detection, each phase being applied with one independent sensing device.

12. The sensing device according to claim 1, in combination with a switchgear, with a circuit breaker, or a vacuum circuit breaker wherein the sensing device is near a pole part which contains the vacuum circuit interrupter.

13. The sensing device according to claim 12, wherein the sensing device is positioned in parallel to the circuit breaker or pole part long axis.

14. The sensing device according to claim 1, wherein the sensing device is configured as a disconnector.

15. The sensing device according to claim 5, comprising:
   low-power current and voltage sensing technologies as current and voltage sensing parts.

16. The sensing device according to claim 15 comprising:
   a current transformer for a current sensing part and/or a voltage transformer for at least one voltage sensing part.

17. The sensing device according to claim 5, wherein the sensing device comprises:
   two voltage sensing parts.

18. The sensing device according to claim 5, wherein the sensing device comprises:
   one voltage sensing part and one current sensing part.

19. The sensing device according to claim 5, wherein the sensing device is configured for three phase detection, each phase being applied with one independent sensing device.

20. The sensing device according to claim 5, in combination with a switchgear, with a circuit breaker, or a vacuum circuit breaker, wherein the sensing device is near a pole part which contains the vacuum circuit interrupter.

* * * * *